United States Patent
Wu

(10) Patent No.: US 12,387,784 B2
(45) Date of Patent: Aug. 12, 2025

(54) MEMORY CIRCUIT

(71) Applicant: UNITED MICROELECTRONICS CORP., Hsin-Chu (TW)

(72) Inventor: Yang-Ling Wu, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 170 days.

(21) Appl. No.: 18/229,182

(22) Filed: Aug. 2, 2023

(65) Prior Publication Data
US 2025/0014637 A1  Jan. 9, 2025

(30) Foreign Application Priority Data

Jul. 4, 2023 (TW) .................................. 112124867

(51) Int. Cl.
*G11C 11/00* (2006.01)
*G11C 11/412* (2006.01)
*G11C 11/419* (2006.01)

(52) U.S. Cl.
CPC .......... *G11C 11/412* (2013.01); *G11C 11/419* (2013.01)

(58) Field of Classification Search
CPC ........................... G11C 11/412; G11C 11/419
See application file for complete search history.

(56) References Cited

U.S. PATENT DOCUMENTS

| | | | |
|---|---|---|---|
| 5,677,875 A | 10/1997 | Yamagata | |
| 9,019,764 B2 | 4/2015 | Lee | |
| 10,685,724 B2 | 6/2020 | Chen | |
| 11,200,924 B2 | 12/2021 | Tsai | |
| 11,631,452 B2* | 4/2023 | Chang | G11C 11/406 365/226 |
| 12,057,179 B2* | 8/2024 | Tseng | G11C 7/1006 |
| 2015/0003151 A1 | 1/2015 | Lee | |
| 2023/0410870 A1* | 12/2023 | Roy | G11C 11/1655 |

* cited by examiner

*Primary Examiner* — Pho M Luu
(74) *Attorney, Agent, or Firm* — Winston Hsu

(57) ABSTRACT

A memory circuit, including multiple storage cells arranged in an array with multiple columns and rows, multiple word lines extending in row direction and connecting with the gates of storage cells, multiple bit lines extending in column direction and connecting respectively with the storage cells, wherein the storage cells in each row correspond to m word lines, m is an integer equal or greater than 2, and the m word lines are sequentially and alternately connected with the storage cells in the row. Alternatively, the storage cells of each column correspond to n bit line, n is an integer equal or greater than 2, and the n bit lines are sequentially and alternately connected with the storage cells in the column.

14 Claims, 2 Drawing Sheets

MEMORY CIRCUIT

BACKGROUND OF THE INVENTION

1. Field of the Invention

The present invention relates generally to a memory circuit, more specifically, to a memory circuit with multiple bit lines or word lines for controlling storage cells of each column and each row.

2. Description of the Prior Art

Memory is widely available semiconductor device, ex. static random access memory (SRAM), dynamic random access memory (DRAM), flash memory, one-time programmable (OTP) memory or multi-time programmable (MTP) memory, which may be used in the application like small size mobile device to big data center.

Every memory cell is connected with word line and bit line, which is essential to the read and write operations of memory. However, with the evolution of nanotechnology, memory cell is made smaller and smaller, and read disturbance gradually become a key factor that affects the reliability of memory. Read disturbance usually occurs after a memory is frequently read. These read actions may alter the bit states of adjacent cells in the read region and cause data error. This is because memory would apply a high voltage when reading the entire word lie for accessing the storage states of cell. In the same time, every column of bit line would select one memory cell and allow the device to read its bit state, ex. "0" or "1". Every read attempt would slightly disturb the control voltage of the cell and, therefore, disturb its bit state. If things go on like this, charges for controlling the cell will keep accumulating, and finally lead to the change of original storage state, and it may restore its initial state only through block clearing.

SUMMARY OF THE INVENTION

In order to solve the aforementioned disturbance issue in conventional skill, the present invention hereby provides a novel memory circuit, with feature of corresponding the storage cells of each row to a plurality of word lines or corresponding the storage cells of each column to a plurality of bit line pairs, so that the disturbance to adjacent storage cells during the activation of word lines or bit lines may be avoid through alternately access of storage cells by different word lines or bit line pairs. In addition, a plurality of word lines or bit lines may simultaneously perform the read/write operations, thereby significantly reducing necessary read/write times and suitable for various memory and digital circuits.

One aspect of the present invention is to provide a memory circuit, including multiple storage cells arranged in an array with multiple columns and rows, multiple word lines extending in row direction and connecting with gates of the storage cells, wherein the storage cells of each row correspond to m word lines, m is an integer equal or greater than 2, and a ath word line of the m word lines is connected with a (xm+a)th storage cell in the row, wherein x is 0 or positive integer, and a is a positive integer equal or less than m, and multiple bit lines extending in column direction and connecting with the storage cells.

Another aspect of the present invention is to provide a memory circuit, including multiple storage cells arranged in an array with multiple columns and rows, multiple word lines extending in row direction and connecting with gates of the storage cells, and multiple bit lines extending in column direction and connecting with the storage cells, wherein the storage cells of each column correspond to n bit lines, n is an integer equal or greater than 2, and a bth bit line in the n bit lines is connected with a (yn+b)th storage cell in the column, y is 0 or positive integer, and b is a positive integer equal or less than n.

These and other objectives of the present invention will no doubt become obvious to those of ordinary skill in the art after reading the following detailed description of the preferred embodiment that is illustrated in the various figures and drawings.

Figure 1:
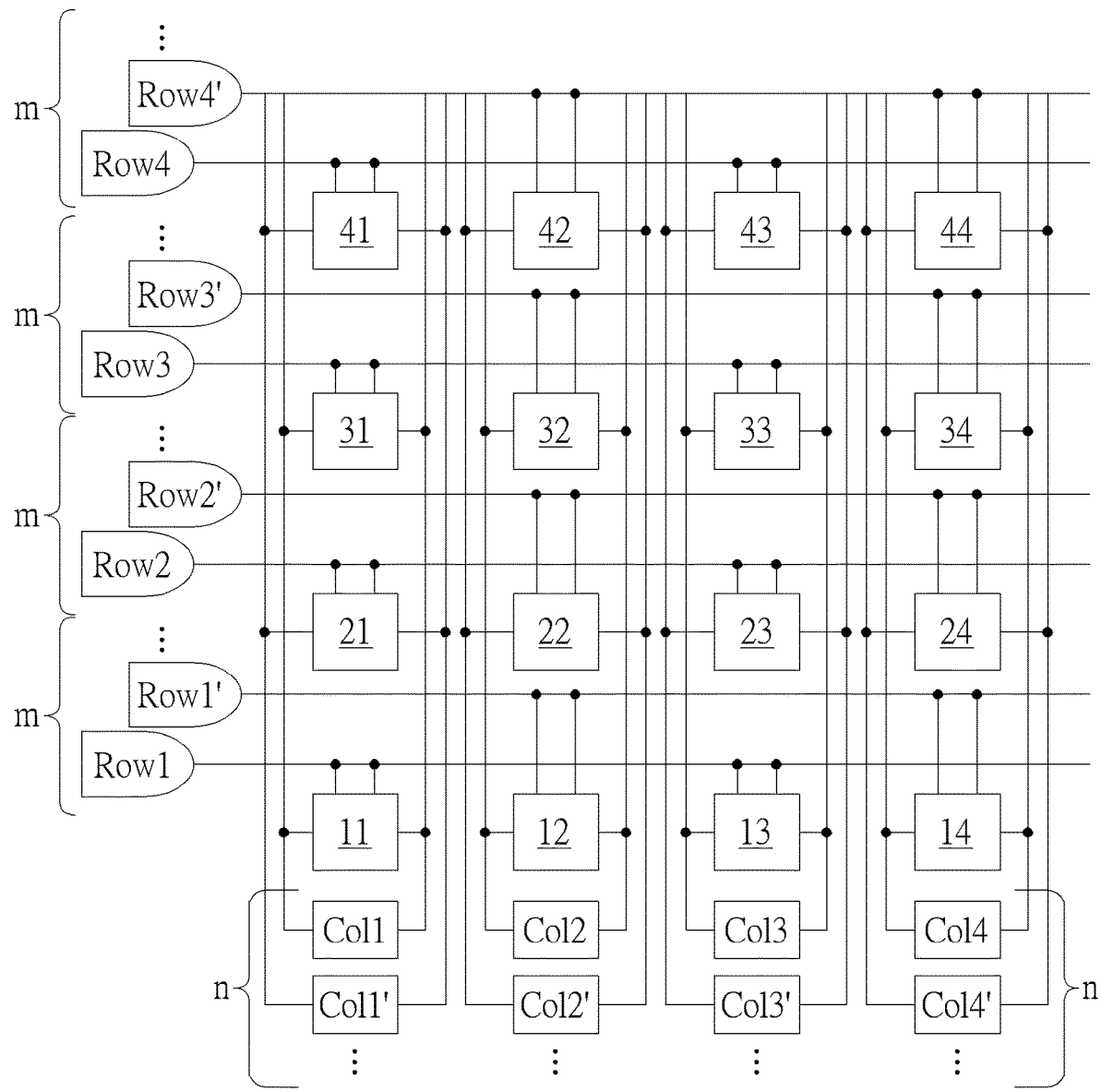
FIG. 1 is a schematic diagram of a memory circuit in accordance with the preferred embodiment of present invention.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present t disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

In general, terminology may be understood at least in part from usage in context. For example, the term "one or more" as used herein, depending at least in part upon context, may be used to describe any feature, structure, or characteristic in a singular sense or may be used to combinations of describe features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

First, please refer to FIG. 1, which is a schematic diagram of a memory circuit in accordance with the preferred embodiment of present invention. The memory circuit of present invention includes multiple storage cells as the storage cells 11-14, 21-24, 31-34, 41-44 shown in the figure, which are arranged in an array with multiple columns and multiple rows. The memory circuit further includes multiple word lines and multiple bit line pairs, ex. word lines Row1-Row4, Row1'-Row4' and bit line pairs Col1-Col4, Col1'-Col4', wherein the word lines Row1-Row4, Row1'-Row4' extend in row direction and are connected with gates of those storage cells 11-14, 21-24, 31-34, 41-44, and each bit line pair includes a bit line and a complementary bit line, which extend in column direction and are connected with these storage cells 11-14, 21-24, 31-34, 41-44. The word lines control the switch of memory through gates during information access, while bit lines are responsible for the charge determination and capacitor charging in the memory.

In the embodiment of present invention, the storage cells of each row (ex. storage cells 11-14 in the figure) correspond to m word lines (ex. word line Row1, word line Row1' . . . and so on in the figure), and the m word lines are sequentially and alternately connected with the storage cells in the row, wherein m may be an integer equal or greater than 2. More specifically, the 1st word line of the m word lines is connected with the (xm+1)th storage cell in the row, the 2nd word line of the m word lines is connected with the (xm+2)th storage cell in the row, the 3rd word line of the m word lines is connected with the (xm+3)th storage cell in the row, and so on, wherein X is 0 or positive integer. For example, the word line Row1 in the figure is connected with storage cells 11 and 13, and the word line Row1' is connected with storage cells 12 and 14. Please note that although the storage cells in each row in the figure correspond to only two word lines, but the concept of present invention is not limited thereto, depending on the requirement and design of the invention. For example, when m is 3, the word line Row1 corresponding to the storage cells of the row is connected with the storage cells 11 and 14, the word line Row1' is connected with the storage cells 12 and 15, and the word line Row1" is connected with the storage cells 13 and 16. In general, the storage cells of each row in the present invention would correspond to m word lines, m is an integer equal or greater than 2, and wherein the ath word line of the m word lines is connected with the (xm+a)th storage cell in the row, x is 0 or positive integer, and a is a positive integer equal or less than m.

In another aspect, in the embodiment of present invention, the storage cells of each column (ex. storage cells 11, 21, 31, 41 in the figure) correspond to n bit line pairs (ex. bit line pair Col1, bit line pair Col1' . . . and so on in the figure), and the n bit line pairs are sequentially and alternately connected with the storage cells in the column, wherein n may be an integer equal or greater than 2. More specifically, the 1st bit line of the n bit lines is connected with the (yn+1)th storage cell in the column, the 2nd bit line of the n bit lines is connected with the (yn+2)th storage cell in the column, the 3rd bit line of the n bit lines is connected with the (yn+3)th storage cell in the column, and so on, wherein y is 0 or positive integer. For example, the bit line pair Col1 in the figure is connected with storage cells 11 and 31, and the bit line pair Col1' is connected with storage cells 21 and 41. Similarly, please note that although the storage cells in each column in the figure correspond to only two bit line pairs, the concept of present invention is not limited thereto, depending on the requirement and design of the invention. For example, when n is 3, the bit line pair Col1 corresponding to the storage cells of the column is connected with the storage cells 11 and 41, the bit line pair Col1' is connected with the storage cells 21 and 51, and the bit line pair Col1" is connected with the storage cells 31 and 61. In general, the storage cells of each column in the present invention would correspond to n bit lines, n is an integer equal or greater than 2, and wherein the bth bit line of the n bit lines is connected with the (yn+b)th storage cell in the column, y is 0 or positive integer, and b is a positive integer equal or less than n.

According to the aforementioned circuit design, the more alternate word lines the storage cells of each row correspond to, the less the influence caused by every word line to adjacent storage cells during operation, thereby significantly alleviating read/write disturbance issue in conventional skill. In addition, since the read/write operation for the storage cells in the row may simultaneously activate a plurality of corresponding word lines, for example simultaneously perform read/write operation of the word lines Row1, Row1', so that necessary read/write time may be significantly reduced, wherein up to half of the read/write time may be saved depending on the number of word lines corresponding to the storage cells of each row. Similarly, the more bit line pairs the storage cells of each column correspond to, the less the influence caused by every bit line pair to adjacent storage cells during operation, thereby significantly alleviating read/write disturbance issue in conventional skill. In addition, since the read/write operation to the storage cells in the column may simultaneously activate a plurality of corresponding bit line pairs, for example simultaneously perform the read/write operation to bit line pairs Col1, Col1', so that necessary read/write time may be significantly reduced, wherein up to half of the read/write time may be saved depending on the number of bit line pairs corresponding to the storage cells of each column.

Figure 2:
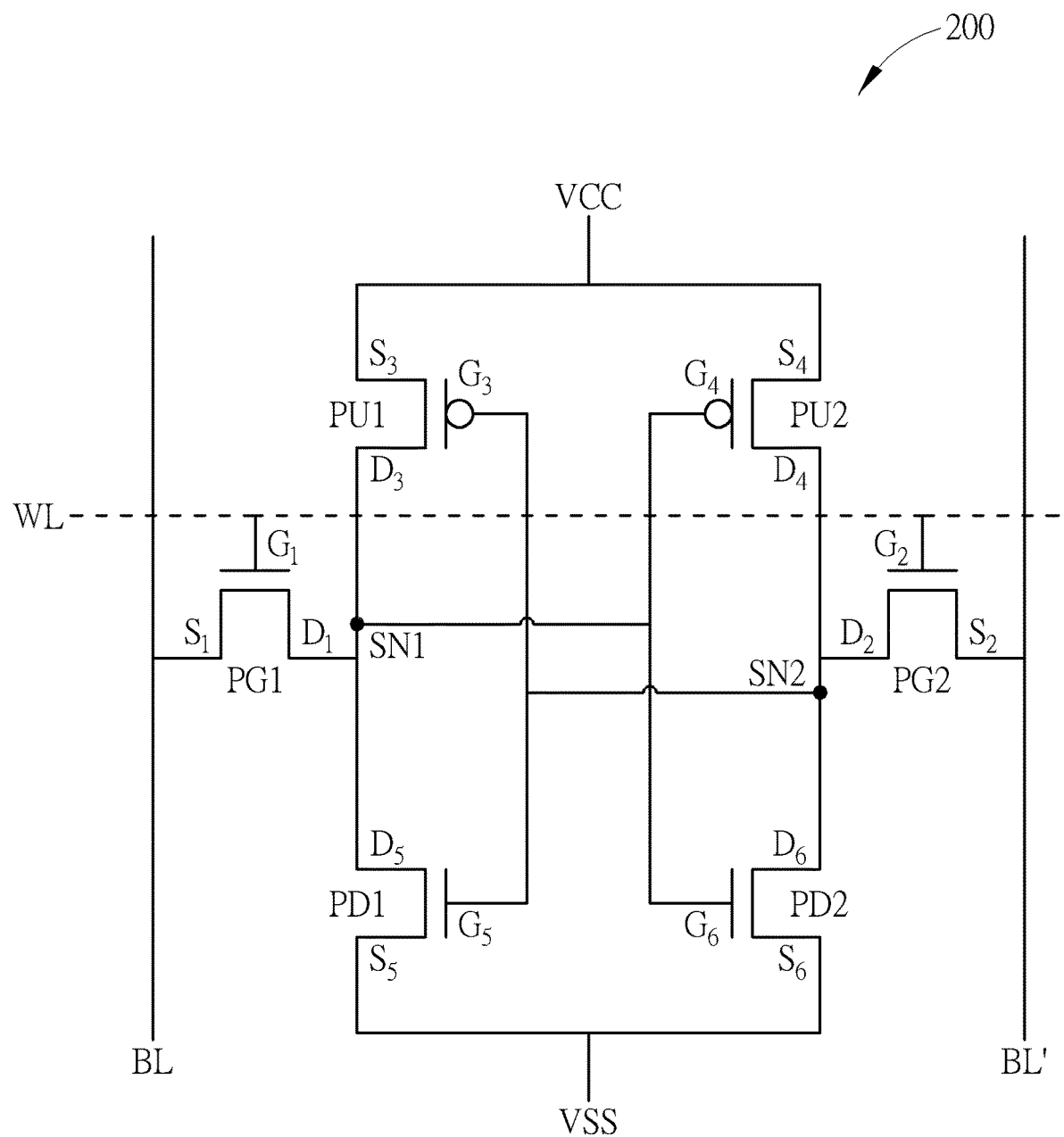
FIG. 2 is a circuit diagram of a storage cell of static random access memory (SRAM) in accordance with one embodiment of the present invention.

Please refer now to FIG. 2, which is a circuit diagram of a storage cell of static random access memory (SRAM) in accordance with one embodiment of the present invention. As shown in FIG. 2, the SRAM storage cell 200 includes six field effect transistors (FETs) and four capacitors (6T4C architecture), wherein four of these FETs (first and second pull-up transistors PU1, PU2 and first and second pull-down transistors PD1, PD2) constitute two cross-coupled inverters. The two inverters are symmetrical to each other and latch the data of "0" and "1" to achieve the effect of data storage, while the other two FETs (first and second pass gate transistors PG1, PG2) functions as control switches of bit lines for read, write and clear operations.

As shown in FIG. 2, the six FETs in the SRAM all consist of three components of gate, source and drain, wherein the sources $S_1$, $S_2$ of first pass gate transistor PG1 and second pass gate transistor PG2 are connected respectively with a bit line BL and a complementary bit line BL', and the drains $D_1$, $D_2$ are connected respectively with a first storage node SN1 and a second storage node SN2, and the gates $G_1$, $G_2$ are connected to a common word line WL. The sources $S_3$, $S_4$ of first pull-up transistor PU1 and second pull-up transistor PU2 are connected to a first common power line VCC, and the drains $D_3$, $D_4$ are connected respectively with first storage node SN1 and second storage node SN2. The word line in this embodiment is exactly one word line in FIG. 1, ex word line Row1, while the bit line BL and complementary bitt line BL' in this embodiment are exactly one bit line pair in FIG. 1, ex. bit line pair Col1, which is connected with one storage cell 200. The storage cell 200 shown in FIG. 2 may correspond exactly to one storage cell in FIG. 1, ex. storage cell 11.

In similar way, the sources $S_5$, $S_6$ of first pull-down transistor PD1 and second pull-down transistor PD2 are connected to a second common power line VSS, and the drains $D_5$, $D_6$ are connected respectively with the first storage node SN1 and second storage node SN2. Accordingly, in addition to the drain $D_1$ of first pass gate transistor PG1, the drain $D_3$ of first pull-up transistor PU1 and the drain $D_5$ of first pull-down transistor PD1, the first storage node SN1 is further connected with the gate $G_4$ of second pull-up transistor PU2 and the gate $G_6$ of second pull-down transistor PD2. In addition to the drain $D_2$ of second pass gate transistor PG2, the drain $D_4$ of second pull-up transistor PU2 and the drain De of second pull-down transistor PD2, the second storage node SN2 is further connected with the gate $G_3$ of first pull-up transistor PU1 and the gate $G_5$ of first pull-down transistor PD1, in order to achieve the effect of mutual latching. In the embodiment of present invention, the two pull-up transistors PU1 and PU2 may be PMOS transistors, while the two pull-down transistors PD1 and PD2 may be NMOS transistors.

The concept of circuit design in the present invention may be applied in all kinds of memory or digital circuits that adopt word lines and bit lines for read operation or write operation, ex. static random access memory (SRAM), dynamic random access memory (DRAM), flash memory, one-time programmable (OTP) memory or multi-time programmable (MTP) memory, etc., but not limited thereto. Please note that, depending on the corresponding memory types, there might be only bit lines provided in the circuit without complementary bit lines, or alternatively, the complementary bit lines may be replaced with conductive lines of other types, ex. source line or ground line. For example, with respect to DRAM, the complementary bit line in the bit line pair may be replaced with a ground line. With respect to flash memory, the complementary bit line in the bit line pair may be replaced with a source line.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory circuit, comprising:
multiple storage cells arranged in an array with multiple columns and rows;
multiple word lines extending in row direction and connecting with gates of said storage cells, wherein said storage cells in each said row correspond to m said word lines, said m is an integer equal or greater than 2, and a ath said word line of said m word lines is connected with a (xm+a)th said storage cell in said row, said x is 0 or positive integer, and said a is a positive integer equal or less than said m, and each of said storage cells is connected to only one of said word lines; and
multiple bit lines extending in column direction and connecting with said storage cells.

2. The memory circuit of claim 1, wherein said storage cells in each said column corresponds to n said bit lines, said n is an integer equal or greater than 1, and a bth said bit line of said n bit lines corresponds to a (yn+b)th said storage cell in said column, said y is 0 or positive integer, and said b is a positive integer equal or less than said n.

3. The memory circuit of claim 2, wherein said n bit lines corresponding to said storage cells in each said column simultaneously perform read operation or write operation.

4. The memory circuit of claim 1, further comprising multiple complementary bit lines extending in said column direction, and each said complementary bit line is paired with one said bit line.

5. The memory circuit of claim 4, wherein said storage cell is static random access memory (SRAM) storage cell.

6. The memory circuit of claim 1, wherein said storage cell is dynamic random access memory (DRAM) storage cell, flash memory storage cell, one-time programmable (OTP) storage cell or multi-time programmable (MTP) storage cell.

7. The memory circuit of claim 1, wherein said m word lines corresponding to said storage cells in each said row simultaneously perform read operation or write operation.

8. A memory circuit, comprising:
multiple storage cells arranged in an array with multiple columns and rows;
multiple word lines extending in row direction and connecting with gates of said storage cells; and
multiple bit lines extending in column direction and connecting with said storage cells, wherein said storage cells in each said column correspond to n said bit lines, said n is an integer equal or greater than 2, and a bth said bit line of said n bit lines is connected with a (yn+b)th said storage cell in said column, said y is 0 or positive integer, and said b is a positive integer equal or less than said n.

9. The memory circuit of claim 8, wherein said storage cells in each said row correspond to m said word lines, said m is an integer equal or greater than 1, and a ath said word line in said m word lines is connected with a (xm+a)th said storage cell in said row, said x is 0 or positive integer, and said a is a positive integer equal or less than said m.

10. The memory circuit of claim 9, wherein said m word lines corresponding to said storage cells in each said row simultaneously perform read operation or write operation.

11. The memory circuit of claim 8, further comprising multiple complementary bit lines extending in said column direction, and each said complementary bit line is paired with one said bit line.

12. The memory circuit of claim 11, wherein said storage cell is static random access memory (SRAM) storage cell.

13. The memory circuit of claim 8, wherein said storage cell is dynamic random access memory (DRAM) storage cell, flash memory storage cell, one-time programmable (OTP) storage cell or multi-time programmable (MTP) storage cell.

14. The memory circuit of claim 8, wherein said n bit lines corresponding to said storage cells in each said column simultaneously perform read operation or write operation.

* * * * *